United States Patent [19]

Kimura et al.

[11] Patent Number: 5,635,746
[45] Date of Patent: Jun. 3, 1997

[54] SEMICONDUCTOR DEVICE COMPRISING A SALICIDE STRUCTURE

[75] Inventors: Masatoshi Kimura; Masao Sugiyama, both of Tokyo, Japan

[73] Assignee: Mitsubishi Denki Kabushiki Kaisha, Tokyo, Japan

[21] Appl. No.: 575,194

[22] Filed: Dec. 20, 1995

[30] Foreign Application Priority Data

Jul. 6, 1995 [JP] Japan .................................. 7-170968

[51] Int. Cl.$^6$ ................................................ H01L 29/76
[52] U.S. Cl. ........................... 257/382; 257/383; 257/384; 257/388; 257/412; 257/413; 257/914
[58] Field of Search ..................................... 257/382, 383, 257/384, 388, 412, 413, 900, 914

[56] References Cited

U.S. PATENT DOCUMENTS 5,021,853  6/1991  Mistry .

FOREIGN PATENT DOCUMENTS

| | | |
|---|---|---|
| 62-76560 | 4/1987 | Japan . |
| 1-103873 | 4/1989 | Japan . |
| 2-257642 | 10/1990 | Japan . |
| 4-15825 | 5/1992 | Japan . |

*Primary Examiner*—Minh-Loan Tran
*Attorney, Agent, or Firm*—Lowe, Price, LeBlanc & Becker

[57] ABSTRACT

After formation a gate electrode and source/drain regions, N ions or O ions are implanted into a predetermined region using a resist mask, and a Ti layer is deposited on the entire face of a substrate, and then the Ti layer is silicided in self-alignment by a heat treatment, whereby a high resistivity TixNySiz mixing layer is formed the predetermined region on the gate electrode and the source/drain regions 10, and a low resistivity TiSi$_2$ layer 12 is formed on another region.

6 Claims, 13 Drawing Sheets

FIGURE 20 (a) PRIOR ART
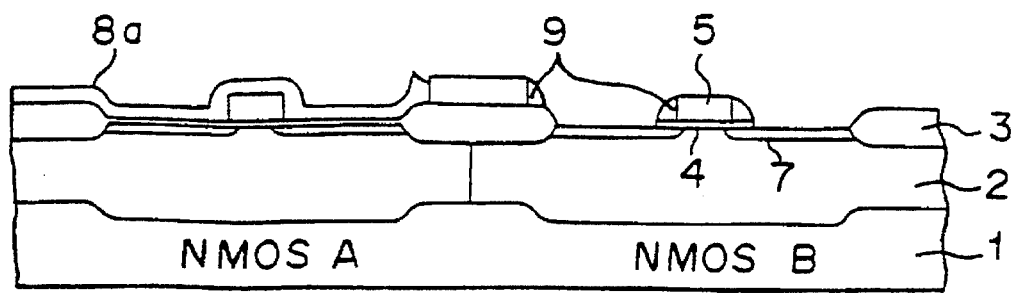
FIGURE 20 (b) PRIOR ART
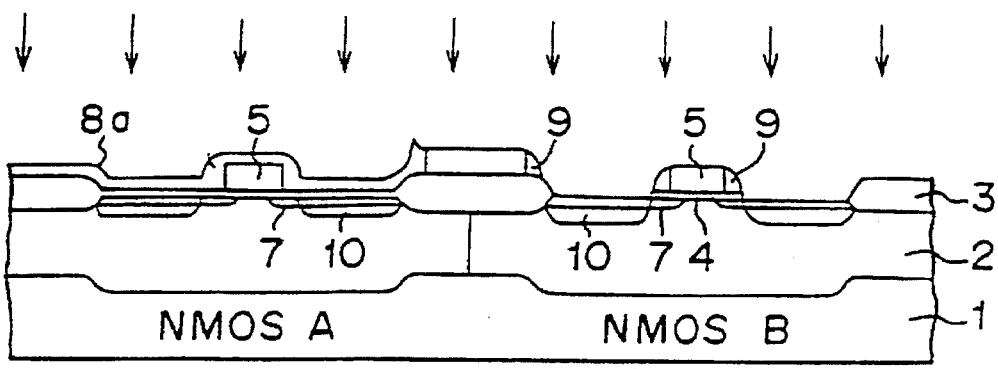
FIGURE 20 (c) PRIOR ART
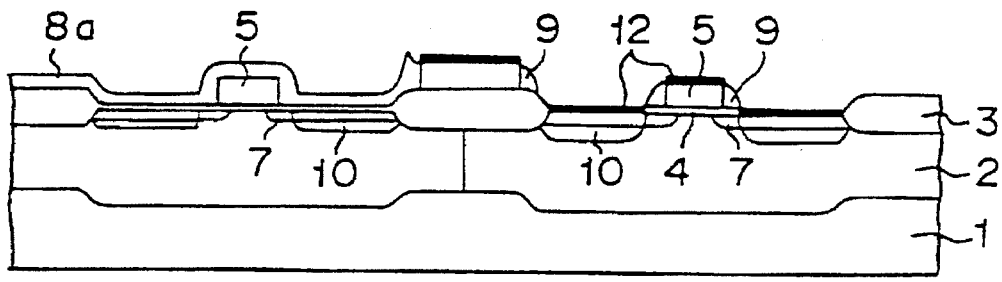

SEMICONDUCTOR DEVICE COMPRISING A SALICIDE STRUCTURE

BACKGROUND OF THE INVENTION

1. Field of the Invention

The present invention relates to semiconductor devices, in particular semiconductor integrated circuit devices using SALICIDE (SELF-ALIGNED SILICIDE) technology.

2. Discussion of Background

As LSIs have developed to larger-scale integration, SALICIDE technology has recently and widely been used to form a silicided layer on a silicon material in self-alignment in order to reduce contact resistance and to form an electrode such as a gate, a source and a drain which has a low resistivity.

An example wherein a process for producing a semiconductor device using the SALICIDE technology as applied to an NMOS transistor will be explained in reference to FIGS. 10–18.

First, a semiconductor substrate 1 (hereinbelow, referred to as the substrate 1) which is made from a P-type single-crystal silicon material has P-well regions 2 (hereinbelow, referred to as the P-wells 2) formed therein. After field insulating films 3 for isolation have been grown using a LOCOS process, a gate oxide film 4 is deposited on the entire face of the substrate. After that, a doped polysilicon film (or doped amorphous silicon film) 5a is deposited on the entire surface of the gate oxide film. After a photoresist film 6 is deposited on the entire surface of the doped polysilicon film, a photolithographic masking and etching technique is applied for patterning the resist film (see FIG. 10).

Next, the photoresist pattern 6 is used as a mask to etch the underlying doped polysilicon film 5a, thereby forming gate electrodes 5 which are used as conductive layers (see FIG. 11).

Next, after the photoresist film 6 is removed (see FIG. 12) impurities such as As and P are introduced from above the substrate 1 using an obligue rotational ion implantation process to form N⁻ type LDD regions 7 (see FIG. 13).

Next, after a TEOS film 8 is deposited on the entire face of the substrate so as to have a film thickness of about 0.05–0.2 μm (see FIG. 14), the TEOS film is etched by anisotropic dry etching to leave side spacers 9 on sidewalls of the gate electrodes 5 (see FIG. 15).

Next, in order to form N⁺ type source/drain regions 10 as conductive layers, impurities such as As and P are introduced from above the substrate 1 using an ion implantation process (see FIG. 16).

Now, a process for forming silicided layers on the gate electrodes 5 and on the source/drain regions 10 using the SALICIDE technology will be explained below.

Using e.g. a sputtering process, a Ti layer 11 as a metallic layer is deposited on the entire face of the substrate 1 which has the source/drain regions 10 formed as stated above (see FIG. 17).

After that, the substrate 1 is subjected to a heat treatment such as lamp annealing to modify the Ti layer 11 into $TiSi_2$ layers 12 as silicided layers having a low resistivity by reaction of the Ti layer 11 with the underlying silicon material. Then, portions of the Ti layer 11 which have not reacted are removed using a solution such as $H_2SO_4/H_2O_2$. In that manner, the $TiSi_2$ layers 12 are formed only on the silicon material, i.e. on the gate electrodes 5 and on the source/drain regions 10 in self-alignment (see FIG. 18).

After that, the NMOS transistor is completed by forming interlayer insulating films and interconnect layers and giving a predetermined treatment (not shown).

By the way, LSIs are generally provided with an input output protection circuit to protect an internal circuit from electrostatic discharge failure (hereinbelow, referred to as ESD) etc. When the SALICIDE technology stated above is applied to form silicided layers having a low resistivity, such as the $TiSi_2$ layer 12 on a gate 5 and source/drain regions of a transistor which constitutes the input output protection circuit, it becomes susceptible to be affected by a surge inputted from an external pad. In particular, corners 13 of the source/drain region 10 shown in FIG. 19 are susceptible to undergo electrical field convergence. The surge reaches the corners 13 through the resistor in the silicided layer (resistivity of the $TiSi_2$ layer 12: about 13–18 μΩ·cm), and junction breakdown is susceptible to occur at the corners. The resistivity of the silicided layer is not more than one-tenth of the resistivity of the diffused layer in the source/drain region 10.

In order to cope with this problem, it has been proposed a production method which prevents such a silicided layer from being formed at a transistor constituting an input output protection circuit when LSIs are produced using the SALICIDE technology.

Such a method for producing semiconductor devices, which has been disclosed in e.g. U.S. Pat. No. 5021853, will be explained in reference to FIG. 20(a)–20(c).

First, in accordance with steps similar to those shown in FIGS. 10–13, N⁻ type LDD regions 7 are introduced after formation of gate electrodes 5. After a TEOS film has been deposited on the entire face of the substrate, selective etching is carried out by anisotropic dry etching using a photoresist mask, thereby leaving the TEOS film 8a on a region with an NMOS transistor A region formed therein, and forming side spacers 9 on sidewalls of gate electrodes 5 on a region with an NMOS transistor B region formed therein (see FIG. 20(a)).

Next, in order to form N⁺ type source/drain regions 10, an ion implantation process is applied to implant impurities such as As and P from above the substrate 1 (see FIG. 20(b)).

Then, a Ti layer is deposited on the entire face of the substrate by e.g. a sputtering process, and a heat treatment such as lamp annealing is given to modify the Ti layer 11 on the silicon material into $TiSi_2$ layers 12. After that, portions of the Ti layer which have not reacted is removed. And in this manner, no $TiSi_2$ layer 12 is formed on the NMOS transistor A region with the TEOS film 8a formed thereon, and the $TiSi_2$ layers 12 are selectively formed on the gate electrodes 5 and on the source/drain regions 10 on the NMOS transistor B region (see FIG. 20(c)).

As a result, when the silicided layers having a low resistivity are formed using the SALICIDE technology, a region where no silicided layer is formed is selectively produced on the common substrate 1.

According to the production method just above mentioned, when the ion implantation is made for forming the source/drain regions 10, the NMOS transistor A region receives the implantation from above the TEOS film 8a, and the NMOS transistor B region receives the implantation from above the silicon substrate 1 which the TEOS film 8 has been removed. As a result, the NMOS transistor A and the NMOS transistor B have different impurity distribution in their source/drain regions 10. Although it is possible to equalize the impurity distribution in the source/drain regions 10 by adding an extra ion implantation step, the fabrication processes become complicated.

A semiconductor device fabrication process by another proposal, which has been proposed to improved this problem, will be explained in reference to FIGS. 21(a)-21(e).

Firstly, in accordance with steps similar to those shown in FIGS. 10–16, N⁻ type LDD regions 7 are formed after formation of gate electrodes 5. After a TEOS film is deposited on the entire face of the substrate, the entire face is subjected to etching to form side spacers 9. After that, N⁺ type source/drain regions 10 are formed.

Next, a second TEOS film 14 is deposited on the entire face of the substrate (see FIG. 21(a)). After a photoresist film 15 is formed on the entire face of the second TEOS film, a photolithographic technique is applied to pattern the photoresist film. Selective etching is carried out by anisotropic dry etching using the patterned photoresist film 15 as a mask, thereby leaving the second TEOS film 14a on the NMOS transistor A region, and to form second side spacers 16 on the gate electrodes 5 on the NMOS transistor B region. Since the gate electrodes 5 have already been formed with the first side spacers 9, the second side spacer 16 are formed on outer surfaces of the first side spacers 9 (see FIG. 21(b)).

After that, the photoresist film 15 is removed (see FIG. 21(c)), and a Ti layer 11 is deposited on the entire face of the substrate by e.g. a sputtering process (FIG. 21(d)). Then, a heat treatment such as lamp annealing is given to modify the Ti layer 11 on the silicon material into $TiSi_2$ layers 12. Portions of the Ti layer 11 which have not reacted is removed. In this manner, no $TiSi_2$ layer 12 is formed on the NMOS transistor A region which the second TEOS film 14a formed thereon, and the $TiSi_2$ layers 12 are selectively formed on the gate electrodes 5 and on the source/drain regions 10 on the NMOS transistor B region (FIG. 21(e)).

Although the problem of creation of different impurity distribution in the source/drain regions 10 can be solved by applying the SALICIDE technology using the second TEOS film 14a as a mask after formation of the source/drain regions 10, the second side spacers 16 are formed on the sidewalls of the gate electrodes 5 when the second TEOS film 14a is patterned. As a result, the area of the $TiSi_2$ layers 12 on the source/drain regions decreases in the NMOS transistor B region by the second side spacers 16, and the diffused layer resistor under the second spacer 16 between paired source and drain works as a series resistor to deteriorate the operation speed of the element.

It is an object of the present invention to solve those problems, and to provide a highly reliable semiconductor device with a high operation speed, wherein a SALICIDE technology is applied to form a silicided layer with a low resistivity on a conductive layer made of a silicon material, wherein a high resistivity region without such a silicided layer is selectively provided to be free from different impurity distribution in source/drain regions between the region with the silicided layer formed therein and the high resistivity region, and wherein the operation speed of an element can be prevented from deteriorating in the silicided layer formation region due to an increase in resistor which is caused by a decrease in the area of the silicided layer.

The foregoing and other objects have been attained by providing a semiconductor device comprising a semiconductor substrate; a conductive layer on the substrate, which is made from a silicon material; and a silicided layer on the conductive layer, which is formed by salicide technology; wherein the silicided layer is partly constituted by a high resistivity silicided layer with N ions or O ions introduced therein.

The present invention also provides a method for preparing a semiconductor device, comprising the steps of forming on a semiconductor substrate a gate electrode to be a conductive layer, the substrate being made from a single-crystal silicon material, the gate electrode being made from a polysilicon material, and forming a side spacer on a sidewall of the gate electrode after formation of an LDD region by ion implantation, and then forming by ion implantation source/drain regions to be a conductive layer; implanting N ions or O ions into a predetermined region using a resist mask; depositing a metallic layer on the entire face of the substrate; and giving a heat treatment to the substrate to in self-alignment silicide portions of the metallic layer which are located on the gate electrode and on the source/drain regions, and then removing portions of the metallic layer which have not reacted.

It is preferable that after the formation of gate electrodes and the source/drain regions, the implantation of N ions or O ions into the predetermined region is made, and the metallic layer is deposited on the entire face of the substrate, and then the heat treatment causes the metallic layer to be silicided in self-alignment, thereby forming a high resistivity silicided layer on the gate electrode and on the source/drain regions in the N ion implanted region or O ion implanted region, and a low resistivity silicided layer on the gate electrode and on the source/drain regions in a region other than the N ion implanted region or O ion implanted region.

It is preferable that after the formation of gate electrodes and the source/drain regions, the metallic layer is deposited on the entire face of the substrate, and the implantation of N ions or O ions into the predetermined region is made, and then the heat treatment causes the metallic layer to be silicided in self-alignment, thereby forming a high resistivity silicided layer on the gate electrode and on the source/drain regions in the N ion implanted region or O ion implanted region, and a low resistivity silicided layer on the gate electrode and on the source/drain regions in a region other than the N ion implanted region or O ion implanted region.

It is preferable that after the formation of gate electrodes and the source/drain regions, the metallic layer is deposited on the entire face of the substrate, and the heat treatment causes the metallic layer to be silicided in self-alignment, and then the implantation of N ions or O ions into the predetermined region is made, thereby forming a high resistivity silicided layer on the gate electrode and on the source/drain regions in the N ion implanted region or O ion implanted region, and a low resistivity silicided layer on the gate electrode and on the source/drain regions in a region other than the N ion implanted region or O ion implanted region.

It is preferable that after the formation of gate electrodes and the source/drain regions, the gate electrodes and the source/drain regions have an epitaxial layer selectively grown thereon, and then the implantation of N ions or O ions and the deposition of the metallic layer are carried out.

It is preferable that the metallic layer is a Ti layer, the Ti layer is deposited on the entire face of the substrate, a protective film which resists $H_2SO_4/H_2O_2$ is formed on the entire surface of the Ti layer, the implantation of N ions or O ions into the predetermined region is made using the resist mask, the resist mask is removed, and the remainder of the resist mask is removed using $H_2SO_4/H_2O_2$, and then the protective film is removed.

The present invention also provides a method for preparing a semiconductor device, comprising the steps of forming on a semiconductor substrate gate electrodes, the substrate being made from a single-crystal silicon material, the gate electrodes being made from a polysilicon material, and forming a side spacer on a sidewall of the gate electrodes after formation of an LDD region by ion implantation, and then forming source/drain regions by ion implantation; selectively forming a metallic layer in a predetermined region on the substrate; and giving a heat treatment to the substrate to in self-alignment silicide the metallic later on the gate electrodes and on the source/drain regions, and then removing portions of the metallic layer which have not reacted; whereby a region with a low resistivity silicided layer formed therein and a region without a low resistivity silicided layer formed therein are provided on the gate electrodes and on the source/drain regions.

It is preferable that the metallic layer is a Ti layer, the Ti layer is deposited on the entire face of the substrate, a protective film which resists $H_2SO_4/H_2O_2$ is formed on the entire surface of the Ti layer, the protective film is etched using a resist mask to be left in the predetermined region, after removal of the resist mask the remainder of the resist mask is removed using $H_2SO_4/H_2O_2$, and the Ti layer which underlies the protective film is etched using the protective film as a mask, and then the protective film is removed, whereby the metallic layer is selectively formed in the predetermined region on the substrate.

It is preferable that the protective film is an $Si_3N_4$ layer.

The present invention also provides a semiconductor device comprising a semiconductor substrate; a conductive layer on the substrate, which is made from a silicon material; and a silicided layer on the conductive layer, which is formed by salicide technology; wherein a high resistivity region is provided by forming on the conductive layer for connection with an external pad a high resistivity silicided layer with N ions or O ions introduced therein so as to surround in an annular manner a contact hole for connection with the external pad, or by forming on the conductive layer for connection with the external pad no silicided layer so as to surround in an annular manner the contact hole for connection the external pad.

The present invention also provides a semiconductor device comprising silicided layers formed on an input driver gate electrode and an output driver gate electrode, and on source/drain regions on a semiconductor substrate by salicide technology; the source/drain regions lying in an output driver, and being connected to an external pad and the input driver gate electrode; a contact hole A for connection with the external pad; and a contact hole B for connection with the input driver gate electrode; wherein the contact hole A is arranged at a side nearer to the output driver gate electrode than the contact hole B, and a high resistivity region is provided by forming a high resistivity silicided layer with N ions or O ions introduced therein at locations which occupy between and around the contact hole A and the contact hole B, or by forming no silicided layer at the locations.

The present invention also provides a semiconductor device comprising silicided layers formed on an input driver gate electrode and an output driver gate electrode, and on source/drain regions on a semiconductor substrate by salicide technology; an external pad; the source/drain regions lying in an output driver; and the external pad, the output driver source/drain regions, and the input driver gate electrode being connected by coupled interconnect layers; wherein a high resistivity region is provided by forming a high resistivity silicided layer with N ions or O ions introduced therein at locations which occupy around a contact hole in the interconnect layer on the output driver source/drain region and on the input driver gate electrode for connection with the interconnect layer, or by forming no silicided layer at the locations.

It is preferable that when the high resistivity silicided layer with N ions or O ions introduced therein is provided, no high resistivity silicided layer is formed at a location near to a boundary portion between the source/drain regions and a field insulating film.

In a semiconductor device according to the present invention, the silicided layer which has been formed on the semiconductor substrate by salicide technology is partly constituted by the high resistivity silicided layer which has N ions or O ions introduced thereinto. This means that a low resistivity silicided layer region and the high resistivity silicided layer regions are both formed on conductive layers made from a silicon material on the semiconductor substrate. As a result, the high resistivity silicided layer can be formed on a portion of the conductive layer for e.g. an input output protection circuit, which is unsuitable for formation of a low-value resistor, depending to applications. The arrangement can improve degrees of freedom in circuitry design and obtain a highly reliable semiconductor device.

A method for producing a semiconductor device according to the present invention include the step to form the silicided layer by salicide technology after formation of the gate electrode and source/drain regions, and the step to implant N ions or O ions into the predetermined region using the resist mask. As a result, the N ion (or O ion) implanted region has the high resistivity silicided layer formed therein, and other regions have the low resistivity silicided layer formed therein, improving degrees of freedom in circuitry design and facilitating the fabrication of a highly reliable semiconductor device.

Such a method can prevent impurity distribution in the source/drain regions in the N ion (or O ion) implanted region and that in the other regions from being different, and avoid an increase in resistance due to a decrease in the area of the low resistivity silicided layer by formation of an extra side spacer, thereby obtaining a highly reliable semiconductor device with high operation speed.

According to an embodiment of the present invention, after formation of the gate electrodes and the source/drain regions, N ions or O ions are implanted into the predetermined region, and then the metallic layer is deposited to be silicided. As a result, metal atoms are prevented from arriving at a deep position near to a PN junction unlike a case wherein N ions (or O ions) are implanted after deposition of the metallic layer, and a deterioration in reliability such as junction leak is avoidable.

According to another embodiment of the present invention, after deposition of the metallic layer, N ions or O ions are implanted into the predetermined region, and then the metallic layer is silicided. Because the N ions (or O ions) are implanted from above the metallic layer, they are prevented from diffusing to a deep position in the semiconductor substrate to restrain a variation in resistance to hot carrier in the element.

According to another embodiment of the present invention, N ions or O ions are implanted into the predetermined region after the metallic layer which has been formed the entire face of the substrate is silicided in self-alignment. As a result, the number of the steps following the master step decreases to improve efficiency in production.

According to another embodiment of the present invention, the gate electrode and the source/drain regions have an epitaxial layer selectively grown thereon, and then implantation of N ions or O ions and deposition of a metallic layer are made. As a result, the silicided layer is formed at a higher position by the thickness of the epitaxial layer to allow the source/drain regions to be formed at a shallow position in the semiconductor substrate, thereby contributing a decrease in junction capacitance.

According to another embodiment of the present invention, the Ti layer is used as the metallic layer, the protective film which resists $H_2SO_4/H_2O_2$ is formed on the Ti layer, and N ions or O ions are implanted using the resist mask. The remainders of the resist mask which has left after removal of the resist mask are removed using $H_2SO_4/H_2O_2$. Although the Ti layer has properties to be attacked by $H_2SO_4/H_2O_2$, the formation of the protective film on the Ti layer prevents the Ti layer from being exposed to $H_2SO_4/H_2O_2$ at the time of removing the remaining portions of the resist mask, avoiding erosion of the Ti layer. As a result, the silicided layer which is made from Ti can be formed in a reliable manner even if $H_2SO_4/H_2O_2$ is used for removal of the resist mask.

According to a semiconductor device fabrication process of the present invention, after formation of the gate electrode and the source/grain regions, the metallic layer is selectively formed on the predetermined region, and the metallic layer is silicided to form on the gate electrode and on the source/drain regions the region with the low resistivity silicided layer formed therein and the region without the low resistivity silicided layer. As a result, it is easy to provide the region without the low resistivity silicided layer formed therein on a gate electrode and on source/drain regions for e.g. an input output protection circuit, which is unsuitable for formation of a low-value resistor, depending to applications. This arrangement can improve degrees of freedom in circuitry design and facilitate fabrication of a highly reliable semiconductor device.

Such a method can prevent impurity distribution in the source/drain regions in the region with the low resistivity silicided layer formed therein and that in the region without the low resistivity silicided layer formed therein from being different unlike the prior art, and avoid an increase in electrical resistance due to a decrease in the area of the low resistivity silicided layer by formation of an extra side spacer, thereby obtaining a highly reliable semiconductor device with high operation speed.

According to another embodiment of the present invention, the Ti layer is used as the metallic layer, and the protective film which resists $H_2SO_4/H_2O_2$ is formed on the Ti layer. The protective film is patterned using the resist mask. After removal of the resist mask, the remaining portions of the resist mask are removed using $H_2SO_4/H_2O_2$. The Ti layer is etched using the left protective film as a mask to selectively form the Ti layer on the predetermined region. As a result, the Ti layer which is left for the subsequent step is covered by the protective film at the time of removing the resist mask, avoiding erosion of the Ti layer due to exposure to $H_2SO_4/H_2O_2$. In this manner, the low resistivity silicided layer which is made from Ti can be formed in a reliable manner even if $H_2SO_4/H_2O_2$ is used for removal of the resist mask.

According to another embodiment of the present invention, the $Si_3N_4$ layer can be used as the protective film to reliably and easily realize the advantage offered by the protective film noted above.

In a semiconductor device according to the present invention, the high resistivity region is formed on the conductive layer for connection with an external pad by forming the high resistivity silicided layer with N ions or O ions introduced thereinto so as to surround a contact hole portion for connecting with the external pad or by forming no silicided layer. Such an arrangement can prevent a surge inputted from the external pad from reaching an internal circuit or a corner of source/drain regions (conductive layer) which are susceptible to cause junction breakdown, which can give an adverse effection to the device. In this manner, the junction breakdown due to the surge can be prevented to improve an input protective function against the surge.

According to another embodiment of the present invention, in the output driver, the contact hole A for connection with the external pad is located at a side nearer to the gate electrode than the contact hole B for connection with the gate electrode for the input driver on the common source/drain regions. The high resistivity region is formed by forming the high resistivity silicided layer with N ion or O ion introduced thereinto so as to occupy between and surround the contact hole A portion and the contact hole B portion or forming no silicided layer. Formation of the high resistivity region can prevent the surge inputted through the external pad from reaching a corner or the source/drain region, and the gate electrode for the input driver, avoiding junction breakdown due to the surge, and improving an input protective function against the surge.

Since the contact hole A for connection with the external pad is arranged at a location nearer to the gate electrode than the contact hole B for connection with the input driver, a delay in output signal can be decreased.

According to another embodiment of the present invention, the external pad, the source/drain regions in the output driver, and the gate electrode in the input driver are sequentially connected by the coupled interconnect layers. As a result, the contact hole for connection with the external pad and the contact hole for connection with the gate electrode in the input driver get common on the source/drain regions in the output driver, allowing not only the area of the source/drain regions to decrease but also junction capacity to lower.

Since the high resistivity region is formed around the contact hole portion for connection with the external pad on the source/drain regions and on the gate electrode in the input driver for connecting with the interconnect layer, the surge inputted from the external pad can be prevented from reaching a corner in the source/drain regions or the input driver, avoiding junction breakdown and improving an input protective function.

According to another embodiment of the present invention, because the high resistivity silicided layer with N ions or O ions introduced thereinto is not formed in the vicinity of a boundary portion with the field insulating film on the source/drain regions, deterioration such as junction leak due to damage by implantation of N ions (or O ions) is prevented from occurring in the vicinity of the boundary portion where a thin oxide film is formed by bird's beak at the time of forming the field insulating film.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein:

FIGS. 20(a)–(c) are cross-sectional views showing another conventional method for producing a semiconductor device.

DESCRIPTION OF THE PREFERRED EMBODIMENTS

Now, preferred embodiments of the present invention will be described in detail with reference to the accompanying drawings. When explanation on the embodiments overlaps with the explanation on the prior art, such part of the explanation on the embodiments will be omitted.

EMBODIMENT 1

Figure 1A:
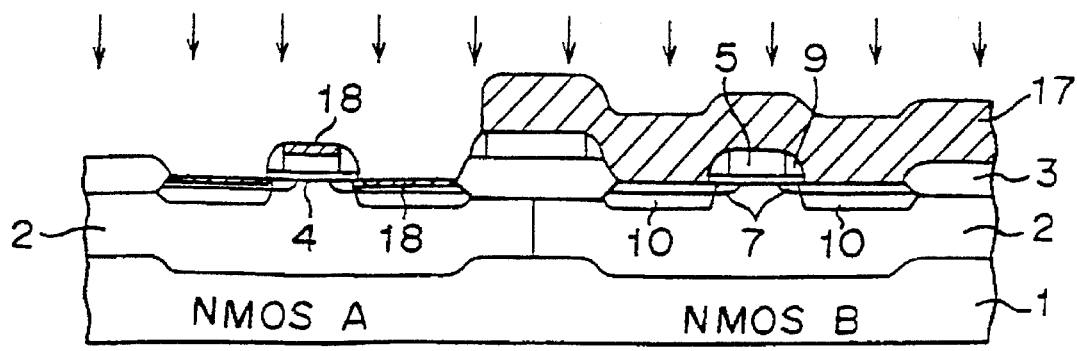
FIGS. 1(a)–(c) are cross-sectional views showing the structure and the production method of the semiconductor device according to a first embodiment of the present invention.
Figure 1B:
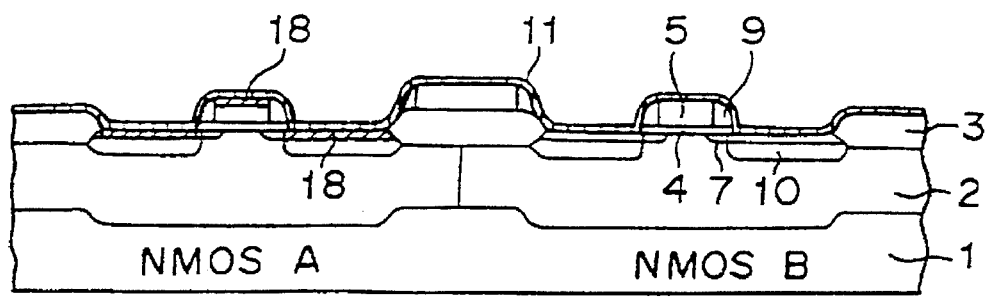
Figure 1C:
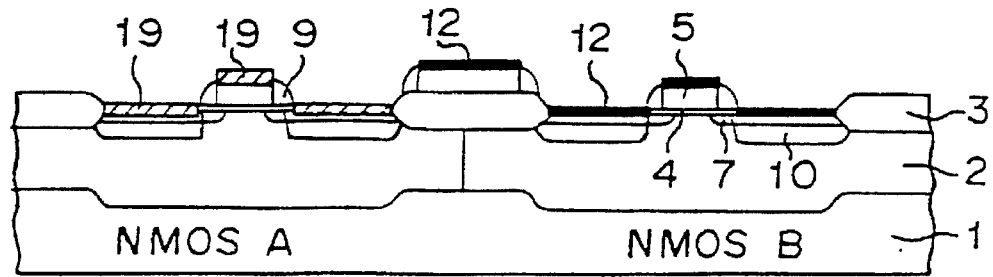

FIGS. 1(a)–(c) are cross-sectional views showing the structure and the production method of the semiconductor device according to a first embodiment of the present invention.

First, in accordance with the steps which are the same as those shown in FIGS. 10–16, $N^-$ type LDD regions 7 are formed after formation of gate electrodes 5, a TEOS film 8 is deposited on the entire face of a substrate, and the TEOS film 8 is etched to provide side spacers 9, and then $N^+$ type source/drain regions 10 are introduced.

Next, after a photoresist film 17 are deposited on the entire face of the substrate to work as a resist mask, the photoresist film is patterned using a photolithographic technique. Using the photoresist pattern 17 as a mask, an ion implantation technique is applied to implant nitrogen (N) ions (or oxygen (O) ions from above the substrate 1 with e.g. implantation energy of 20 KeV–90 KeV and with e.g. an implantation amount of $4E15$–$5E16$ ions/cm$^{-2}$. In this manner, N ion (or O ion) implanted silicon layers 18 are formed at a gate electrode 5 and at source/drain regions 10 in an NMOS transistor A region (see FIG. 1(a)).

Next, after removal of the photoresist film 17, if it is necessary to restore the damage due to the ion implantation in the previous step and to make diffusion, the substrate is subjected to a heat treatment such as lamp annealing. After that, a Ti layer 11 is deposited on the entire face of the substrate by e.g. a sputtering process (FIG. 1(b)).

Next, the substrate 1 is subjected to a heat treatment such as lamp annealing to react the Ti layer 11 on the silicon substrate with the underlying silicon material to silicide the Ti layer. As a result, the Ti layer 11 on the N ion (or O ion) implanted silicon layers 18 is modified into mixing layers 19 of TixNySiz (or TixOySiz) in the NMOS transistor A region, and the Ti layer 11 on the silicon substrate is modified into TiSi$_2$ layers 12 in the NMOS transistor B region. After that, portions of the Ti layer 11 which have not reacted is removed using a solution such as $H_2SO_4/H_2O_2$. In this manner, the TiSi$_2$ layers 12 as low resistivity silicided layers are formed on the gate electrode 5 and on the source/drain regions 10 in the NMOS transistor B region while the TixNySiz (or TixOySiz) mixing layers 19 as high resistivity silicided layers are formed on the gate electrode 5 and on the source/drain regions 10 in the NMOS transistor A regions (FIG. 1(c)).

After that, the semiconductor device is completed by forming interlayer insulating films and interconnect layers, and giving a predetermined treatment (not shown).

It has been known that the TixNySiz (or TixOySiz) mixing layers 19 formed in the first embodiment is silicided layers which have a significantly greater resistance than the TiSi$_2$ layers 12.

In summary, in accordance with the first embodiment, N ions (or O ions) are selectively introduced into the NMOS transistor A region prior to use of the salicide technology, whereby the TixNySiz (or TixOySiz) mixing layers 19 which are of great resistance are formed on the gate electrode 5 and on the source/drain regions 10 in the ion implanted region (the NMOS transistor A region) while the TiSi$_2$ layers 12 which are of small resistance are formed on the gate electrodes 5 and on the source/drain regions 10 in the other region (the NMOS transistor B region).

As a result, the region with the low resistivity TiSi$_2$ layers 12 formed therein, and the region with the high resistivity TixNySiz (or TixOySiz) mixing layers 19 formed therein can be selectively and easily formed on the common substrate 1. Both formation regions are the same as each other in terms of impurity distribution in the source/drain regions 10. A decrease in the area of the TiSi$_2$ layers 12 on the source/drain regions 10 in the regions with the TiSi$_2$ layers 12 formed therein is avoidable unlike the prior art.

In addition, implantation of N ions (or O ions) prior to formation of the Ti layers 11 can prevent Ti atoms from arriving in the vicinity of a PN junction by knock-on, and avoid deterioration in reliability such as junction leak.

The implantation may use $N_2$ ions or $O_2$ ions instead of N ions or O ions. The terms "N ions" and "O ions" in the specification include $N_2$ ions and $O_2$ ions, respectively. Implantation conditions for N ions or O ions are different depending on the film thickness of the $TiSi_2$ layers 12 and set resistance values.

Other production methods than the semiconductor device production method described with reference to the first embodiment will be explained as a second embodiment to a fifth embodiment.

EMBODIMENT 2

FIGS. 2(a)–(d) are cross-sectional views showing the semiconductor device production method according to the second embodiment of the present invention.

First, in accordance with the steps which are the same as those shown in FIGS. 10–16, $N^{-1}$ type LDD regions 7 are formed after formation of gate electrodes 5, a TEOS film 8 is deposited on the entire face of a substrate, and the TEOS film 8 is etched, and then $N^+$ type source/drain regions 10 are introduced.

Figure 2:
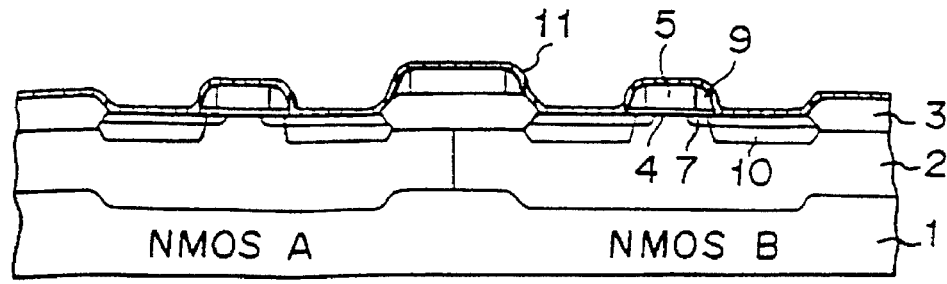
FIGS. 2(a)–(d) are cross-sectional views showing the production method of the semiconductor device according to a second embodiment of the present invention.
Figure 2:
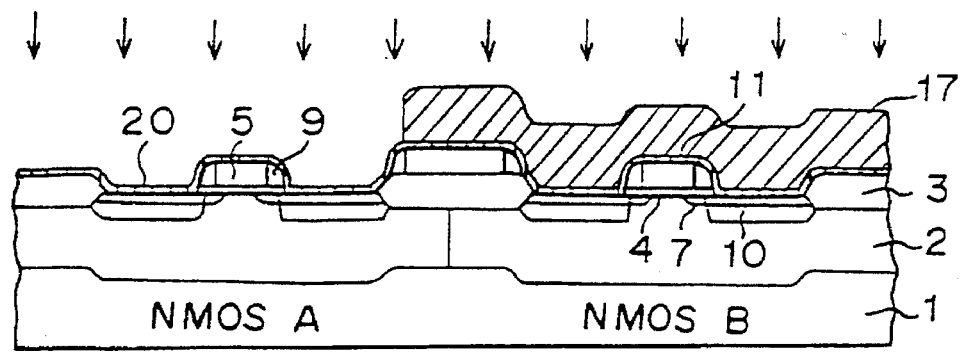
Figure 2:
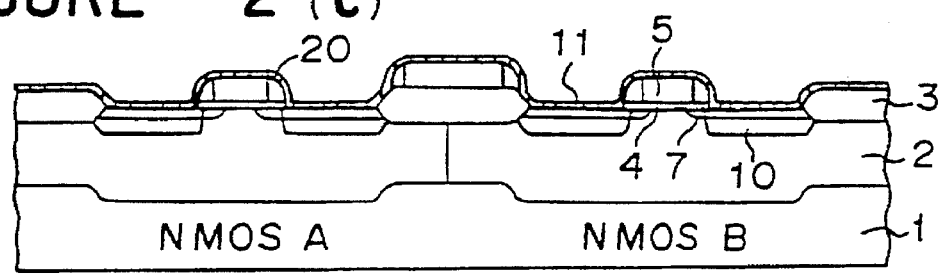
Figure 2:
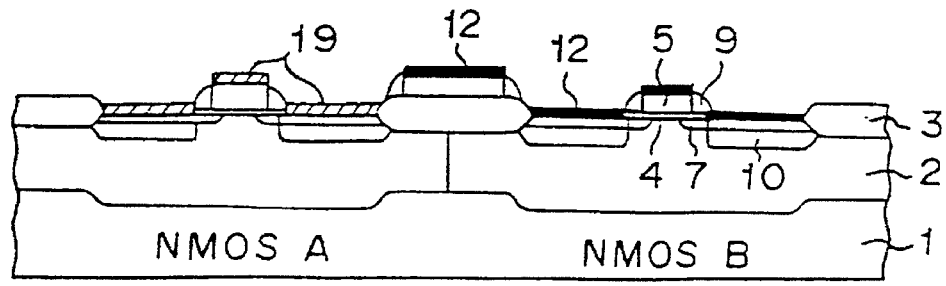

Next, a Ti layer 11 is deposited on the entire face of the substrate using e.g. a sputtering process (FIG. 2(a)).

Next, a photoresist film 17 is deposited on the entire face of the Ti layer, and the photoresist film is patterned using a photolithographic technique. Using the photoresist pattern 17 as a mask, an ion implantation technique is applied to implant N ions (or O ions) from above the substrate 1. In this manner, the N ions (O ions) are implanted into the Ti layer 11 in an NMOS transistor A region to form an N ion (or O ion) implanted Ti layer 20 (FIG. 2(b)).

Next, after removal of the photoresist film 17 (FIG. 2(c)), the substrate 1 is subjected to a heat treatment such as lamp annealing to react the Ti layer 11 and the N ion (or O ion) implanted Ti layer 20 on the silicon substrate with the underlying silicon material to silicide both layers. As a result, the N ion (or O ion) implanted Ti layer 20 is modified into TixNySiz (or TixOySiz) mixing layers 19 in the NMOS transistor A region while the Ti layer 11 is modified into $TiSi_2$ layers 12 in the NMOS transistor B region. Portions of the Ti layers 11 and 20 which have not reacted are removed using a solution such as $H_2SO_4/H_2O_2$ (FIG. 2(d)).

After that, the semiconductor device is completed by giving the same treatment as the first embodiment.

In accordance with the second embodiment, the region with the low resistivity $TiSi_2$ layers 12 formed therein, and the region with the high resistivity TixNySiz (TixOySiz) mixing layers 19 formed therein can be selectively and easily formed on the common substrate 1 like the first embodiment. Both formation regions are the same as each other in terms of impurity distribution in the source/drain regions 10. A decrease in the area of the $TiSi_2$ layers 12 on the source/drain regions 10 in the region with the $TiSi_2$ layers 12 formed therein is avoidable unlike the prior art.

In addition, in accordance with the second embodiment, implantation of N ions (O ions) after formation of the Ti layer 11 can prevent N ions (or O ions) from diffusing deeply in the substrate 1 to restrain a variation in resistance to hot carrier in the element.

EMBODIMENT 3

Now, the semiconductor device production method according to the third embodiment of the present invention will be described with reference to FIGS. 3(a)–(d).

First, in accordance with the steps which are the same as the those shown in FIGS. 10–16, $N^-$ type LDD regions 7 are formed after formation of gate electrodes 5, a TEOS film 8 is deposited on the entire face of a substrate, and the TEOS film is edged, and then $N^+$ type source/drain regions 10 are introduced.

Figure 3:
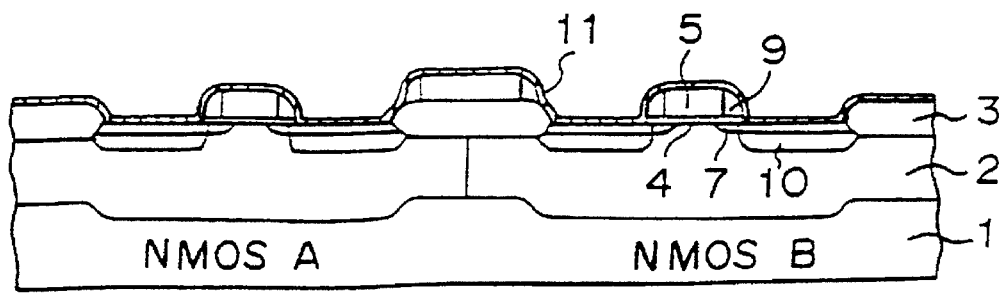
FIGS. 3(a)–(d) are cross-sectional views showing the production method of the semiconductor device according to a third embodiment of the present invention.
Figure 3:
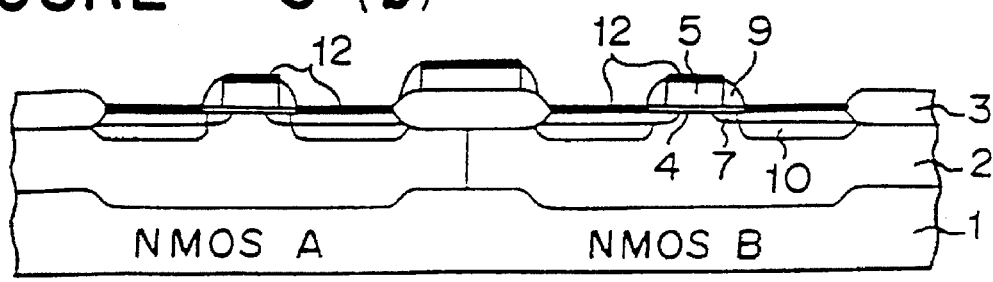
Figure 3:
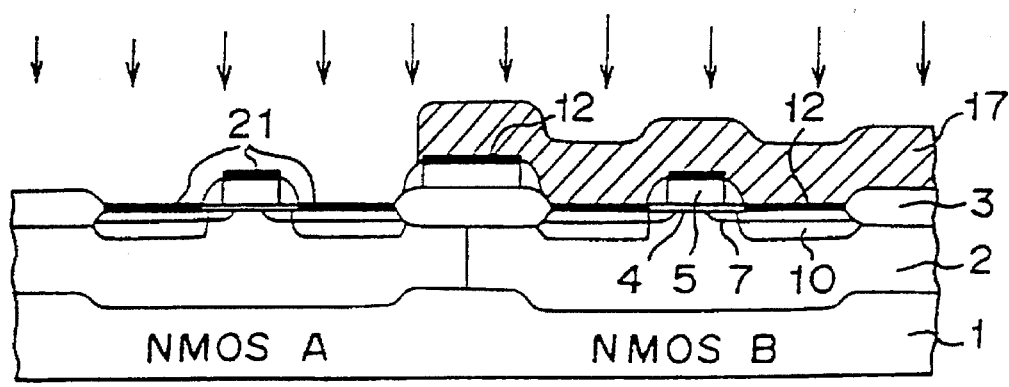
Figure 3:
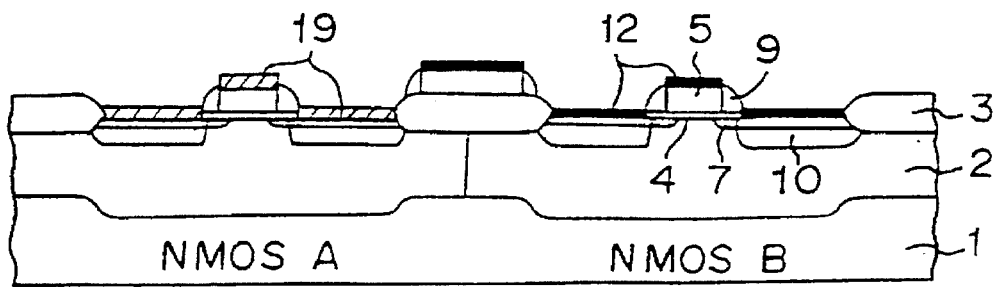

Next, a Ti layer 11 is deposited on the entire face of the substrate by e.g. a sputtering process (FIG. 3(a)). The substrate 1 is subjected to a heat treatment such as lamp annealing to silicide the Ti layer 11 on the silicon substrate to modify it into $TiSi_2$ layers 12. After that, portions of the Ti layer 11 which have not reacted are removed using a solution such as $H_2SO_4/H_2O_2$ (FIG. 3(b)).

Next, a photoresist film 17 is deposited on the entire face of the substrate, and the photoresist film is patterned using a photolithographic technique. Using the photoresist pattern 17 as a mask, N ions (or O ions) are implanted from above the substrate 1. In this manner, the N ions (or the O ions) are implanted into the $TiSi_2$ layers 12 in the NMOS transistor A region to provide N ion (or O ion) implanted $TiSi_2$ layers 21 (FIG. 3(c)).

Next, after removal of the photoresist film 17, the substrate 1 is subjected to a heat treatment to modify the N ion (or O ion) implanted $TiSi_2$ layers 21 into TixNySiz (or TixOySiz) mixing layers 19 (FIG. 3(d)).

After that, the semiconductor device is completed by forming interlayer insulating films and interconnect layers, and giving a predetermined treatment (not shown).

In accordance with the third embodiment, the region with the low resistivity $TiSi_2$ layers 12 formed therein, and the region with the high resistivity TixNySiz (or TixOySiz) mixing layers 19 formed therein can be selectively and easily formed on the common substrate 1 like the first and second embodiments. Both formation regions are the same as each other in terms of impurity distribution in the source/drain regions 10. A decrease in the area of the $TiSi_2$ layers 12 on the source/drain regions 10 in the regions with the $TiSi_2$ layers 12 formed therein is avoidable unlike the prior art.

In addition, since the $TiSi_2$ layers 12 are selectively and partly modified into the TixNySiz (or TixOySiz) mixing layers 19 after formation of the $TiSi_2$ layers 12 on the silicon material using a normal salicide technology, the steps until formation of the $TiSi_2$ layers 12 can be dealt with by a master process. After that, it is enough to determine in which area the region with the TixNySiz (or TixOySiz) mixing layers 19 formed therein is provided. As a result, the number of the steps subsequent to the master process can decrease to improve efficiency in production.

The heat treatment after implantation of the N ions (or O ions) may be carried out together with e.g. reflowing at the time of forming interlayer insulating films.

EMBODIMENT 4

Now, the semiconductor device production method according to the fourth embodiment of the present invention will be described with reference to FIGS. 4(a)–(d).

First, in accordance with the steps which are the same as those shown in FIGS. 10–16, $N^-$ type LDD regions 7 are formed after formation of gate electrodes 5, a TEOS film 8 is deposited on the entire face of a substrate, and the TEOS film is etched, and then $N^+$ type source/drain regions 10 are introduced.

Figure 4:
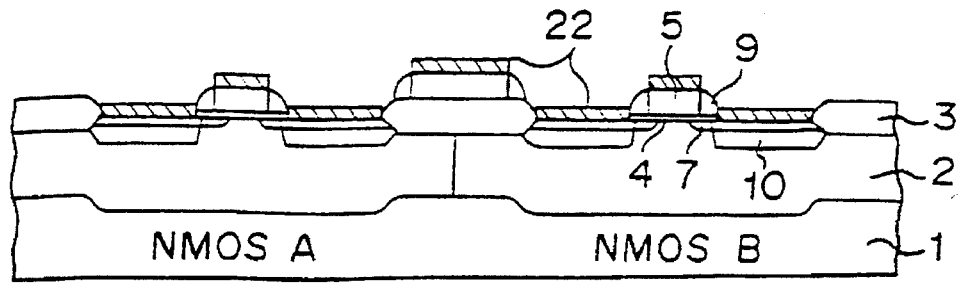
FIGS. 4(a)–(d) are cross-sectional views showing the production method of the semiconductor method according to a fourth embodiment of the present invention.
Figure 4:
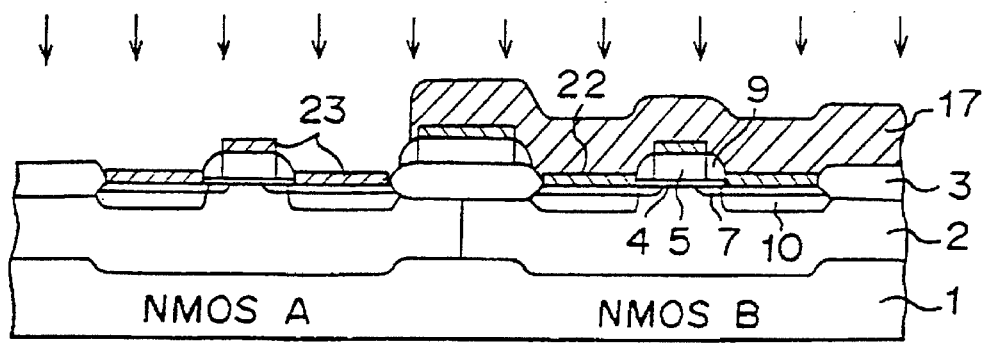
Figure 4:
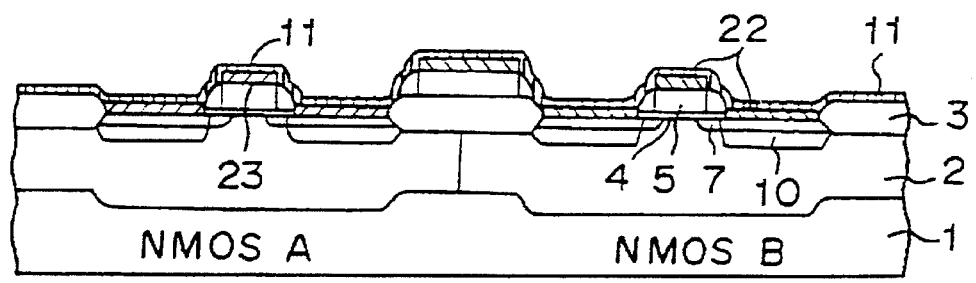
Figure 4:
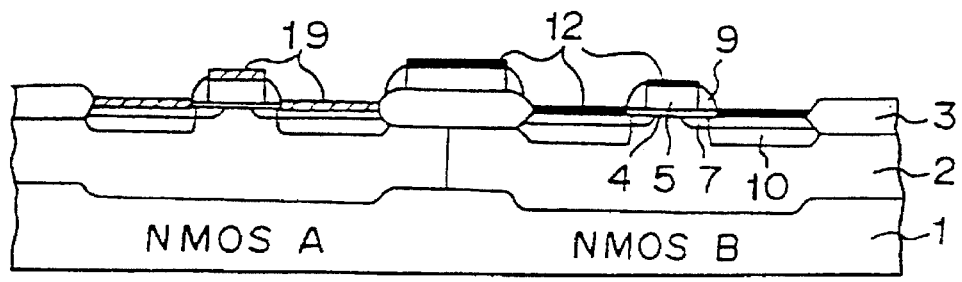

Next, epitaxial layers which are made from a silicon material are selectively grown on the gate electrodes 5 and on the source/drain regions 10 to provide selective epitaxial growth layers 22 as epitaxial layers (FIG. 4(a)).

Next, a photoresist film 17 is deposited on the entire face of the substrate, and the photoresist film is patterned by a photolithographic technique. Using the photoresist pattern 17 as a mask, N ions (or O ions) are implanted from above the substrate 1 by an ion implantation process. In this manner, the N ions (or O ions) are implanted into the selective epitaxial growth layers 22 in the NMOS transistor A region to form N ion (or O ion) implanted selective epitaxial growth layers 23 (FIG. 4(b)).

Next, if it is necessary to restore damage due to the ion implantation in the previous step and to make diffusion, the substrate is subjected to a heat treatment such as lamp annealing after removal of the photoresist film 17.

After that, in accordance with the steps which are the same as those of the first embodiment, a Ti layer 11 is formed (FIG. 4(c)), the Ti layer is silicided by a heat treatment, and portions of the Ti layer 11 which have not reacted are removed. In this manner, the Ti layer 11 on the N ion (or O ion) implanted selective epitaxial growth layers 23 are modified into TixNySiz (or TixOySiz) mixing layers 19 in the NMOS transistor A region while the Ti layer 11 on the selective epitaxial growth layers 22 are modified into $TiSi_2$ layers 12 in the NMOS transistor B region (FIG. 4(d)).

After that, the semiconductor device completed by receiving the same treatment as that in the first embodiment.

In accordance with the fourth embodiment, after formation of the source/drain regions 10, the selective epitaxial growth layers 22 are formed and the Ti layer 11 on the epitaxial growth layers is silicided by use of the silicon material included in the epitaxial growth layer. As a result, the silicided layers 12 and 19 are formed at a higher position by the thickness of the selective epitaxial growth layers 22. This method allows the source/drain regions 10 to be formed in a shallow portion, decreasing junction capacitance.

Although in the fourth embodiment the N ions (or O ions) are implanted into the selective epitaxial growth layers 22, the N ions (or O ions) may be implanted after formation of the Ti layer 11 or after formation of the $TiSi_2$ layers 12 like the second embodiment and the third embodiment.

Although in the first to fourth embodiments the Ti layer 11 is used as the metallic layer for siliciding, other refractory metals such as W, Ni and Co, or near-noble metals may be used as long as they can be silicided.

EMBODIMENT 5

Now, the semiconductor device production method according to the fifth embodiment of the present invention will be described with reference to FIGS. 5(a)–(d).

Figure 5:
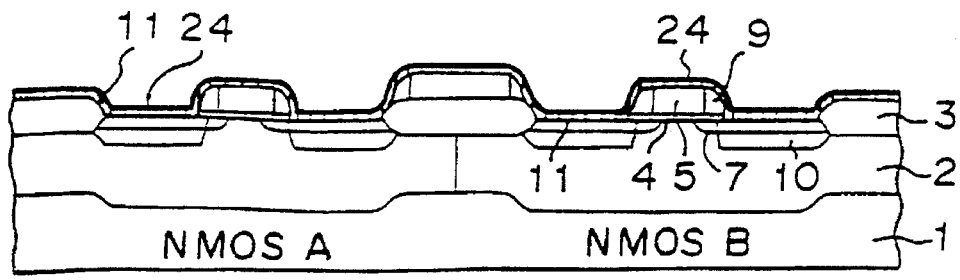
FIGS. 5(a)–(d) are cross-sectional views showing the production method of the semiconductor device according to a fifth embodiment of the present invention.
Figure 5:
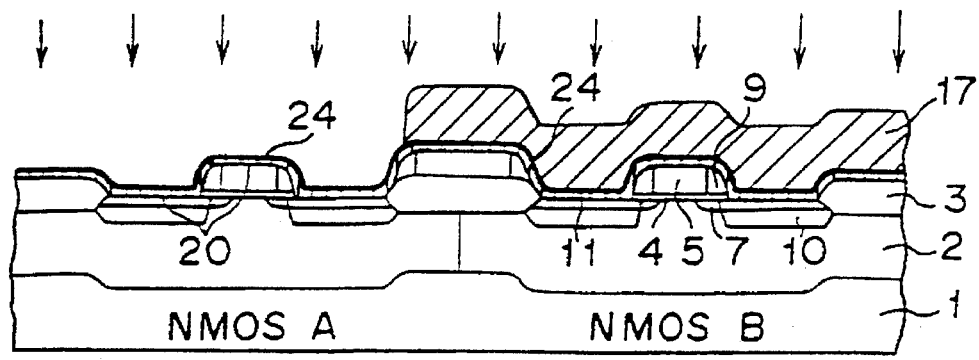
Figure 5:
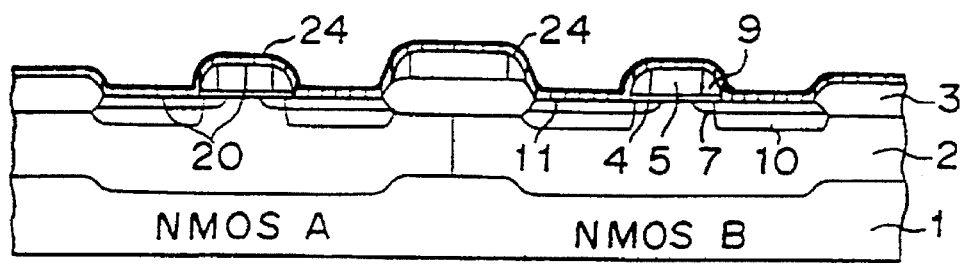
Figure 5:
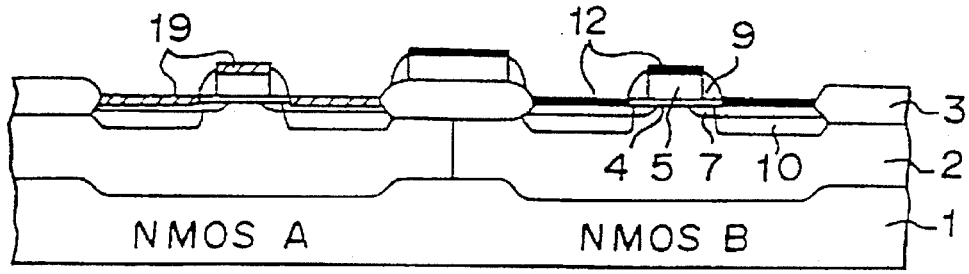

After the steps up to formation of the Ti layer 11 have been carried out like the second embodiment, an $Si_3N_4$ layer 24 is deposited on the entire face of the Ti layer 11 to work as a protective film (FIG. 5(a)).

Next, a photoresist film 17 is deposited on the entire face of the protective film, and the photoresist film is patterned using a photolithographic technique. Using the photoresist pattern 17 as a mask, N ions (or O ions) are implanted into the Ti layer 11 from above the substrate 1 through the $Si_3N_4$ layer 24 by an ion implantation process to form an N ion (or O ion) implanted Ti layer 20 (FIG. 5(b)).

Next, the photoresist film 17 is removed by e.g. an asher, and the remaining portions of the photoresist film 17 are removed using a solution such as $H_2SO_4/H_2O_2$ (FIG. 5(c)).

Next, after removal the $Si_3N_4$ layer 24 using a solution such as $H_3PO_4$, the substrate 1 is subjected to a heat treatment such lamp annealing like the second embodiment, and then the portions of the Ti layers 11 and 20 which have not reacted are removed using a solution such as $H_2SO_4/H_2O_2$ (FIG. 5(d)).

In accordance with the fifth embodiment, the $Si_3N_4$ layer 24 is deposited on the entire face of the Ti layer 11 before the photoresist film 17 which works as an implantation mask for the N ions I (or O ions) in the second embodiment is deposited. After removal of the photoresist film 17, the $Si_3N_4$ layer 24 is removed.

Although it is general that removal of the photoresist film is carried out by e.g. an asher, and then that the remaining portions of the photoresist film are removed by a wet treatment, removal of the remaining portions uses a solution of $H_2SO_4/H_2O_2$ like the fifth embodiment, depending on the kind of the photoresist film. The $H_2SO_4/H_2O_2$ solution is also used to remove the non-reacted portions of the Ti layers 11 and 20, and can attack the Ti layer 11.

In accordance with the fifth embodiment, formation of the $Si_3N_4$ layer 24 on the entire face of the Ti layer 11 can prevent the Ti layers 11 and 20 from being exposed to $H_2SO_4/H_2O_2$ at the time of removing the photoresist film 17, avoiding erosion of the Ti layers 11 and 20. As a result, even if $H_2SO_4/H_2O_2$ is used to remove the photoresist film 17, the silicided layers 12 and 19 made from Ti can be formed in a reliable manner.

As the protective film, other materials which are resistant to $H_2SO_4/H_2O_2$ and can be easily formed and removed may be used.

EMBODIMENT 6

Now, the structure and the production method of the semiconductor device according to the sixth embodiment of the present invention will be described with reference to FIGS. 6(a)–(e).

Firstly, in accordance with the steps which are the same as those shown in FIGS. 10–16, N⁻ type LDD regions 7 are formed after formation of gate electrodes 5, a TEOS film 8 is deposited on the entire face of a substrate, and the TEOS film is etched, and then N⁺ type source/drain regions 10 are introduced.

Figure 6:
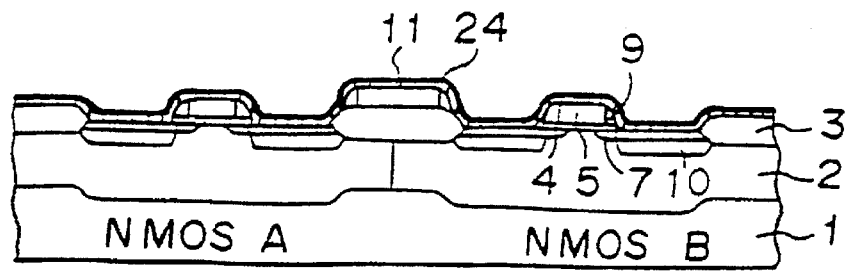
FIGS. 6(a)–(e) are cross-sectional views showing the structure and the production method of the semiconductor device according to a sixth embodiment of the present invention.
Figure 6:
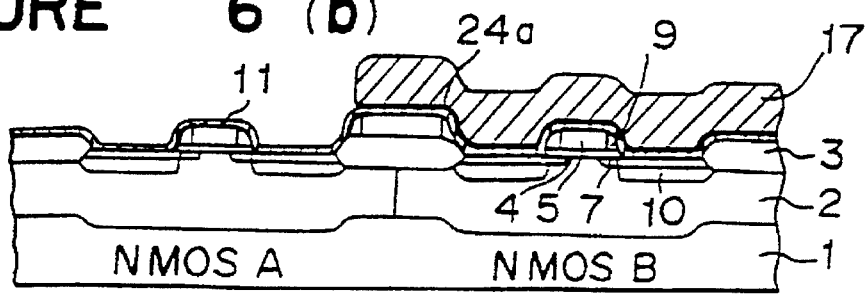
Figure 6:
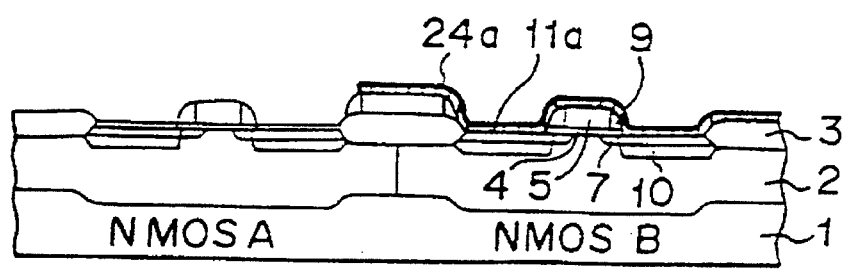
Figure 6:
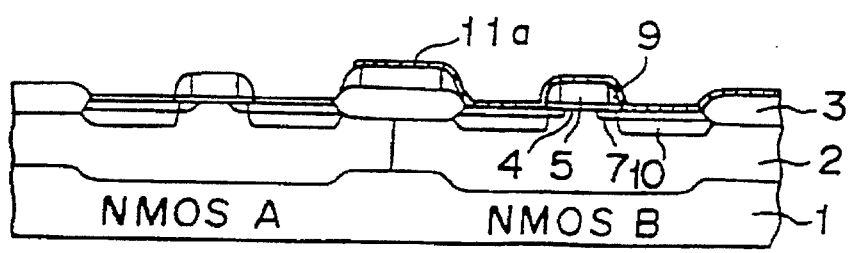
Figure 6:
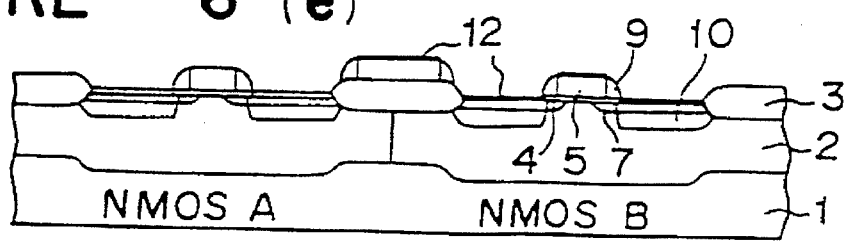

Next, a Ti layer 11 is deposited on the entire face of the substrate by e.g. a sputtering process, and an $Si_3N_4$ layer 24 is deposited on the entire face of the Ti layer (FIG. 6(a)).

Next, a photoresist film 17 is deposited on the entire face of the $Si_3N_4$ layer, and the photoresist film is patterned by a photolithographic technique. Using the photoresist pattern 17 as a mask, the underlying $Si_3N_4$ layer 14 is etched for removal to leave to the $Si_3N_4$ layer 24a only in the NMOS transistor B region (FIG. 6(b)).

Next, the photoresist film 17 is removed by e.g. an asher, and the remaining portions of the photoresist film 17 are removed using a solution of $H_2SO_2/H_2O_2$. Subsequently, using the $Si_3N_4$ layer 24a as a mask, the underlying Ti layer 11 is etched for removal to leave the Ti layer 11a only in the NMOS transistor B region (FIG. 6(c)).

Next, a solution of $H_3PO_4$ is used to remove the $Si_3N_4$ layer 24a (FIG. 6(d)), and the substrate 1 is subjected to a heat treatment such as lamp annealing to modify the Ti layer 11a on the silicon material into $TiSi_2$ layers 12, and then portions of the Ti layer 11a which have not reacted are removed using a solution such as $H_2SO_4/H_2O_2$ (FIG. 6(e)).

After that, the semiconductor device is completed by receiving the same treatment as the first embodiment 1.

In accordance with the sixth embodiment, the $TiSi_2$ layers 12 which work as low resistivity silicided layers are formed only in the NMOS transistor B region while no silicided layer is formed in the NMOS transistor A region. The region with the TiSi$_2$ layers 12 formed therein, and the region without the TiSi$_2$ layers formed therein are the same as each other in terms of impurity distribution in the source/drain regions 10. A decrease in the area of the TiSi$_2$ layers 12 on the source/drain regions 10 in the region with the TiSi$_2$ layers 12 formed therein is avoidable unlike the prior art.

Because the Si$_3$N$_4$ layer 24a covers by the left Ti layer 11a in the subsequent steps after the removable of the photoresist film 17, the Ti layer 11a can be prevented from being exposed to H$_2$SO$_4$/H$_2$O$_2$, avoiding erosion.

In this embodiment, the Si$_3$N$_4$ layer 24 may be replaced by other materials which are resistant to H$_2$SO$_4$/H$_2$O$_2$ like the fourth embodiment.

When H$_2$SO$_4$/H$_2$O$_2$ is not used for removal of the photoresist film 17 depending on its kind, or when a metallic layer other than the Ti layer 11, which resists to H$_2$SO$_4$/H$_2$O$_2$, is used, it is not necessary to use the Si$_3$N$_4$ layer 24 and possible to etch the metallic layer directly using the resist mask 17.

Although explanation of the first to sixth embodiments as stated earlier has been made for the case wherein the present invention is applied to the NMOS transistor, the present invention is also applicable to a PMOS transistor. The low resistivity region with the TiSi$_2$ layers 12 and the high resistivity region without the TiSi$_2$ layers 12 (or the region with the TixNySiz mixing layers 19), which are determined by location of the photoresist mask 17, can be arranged not only at every transistor but also at any location. For example, the diffusion layer of a single pattern for a gate electrode 5 or a single source region (or drain region) can be divided into the region with the TiS$_2$ to layer 12 and the region without the TiS$_2$ layer (or the region with the TixNySiz mixing layer 19).

EMBODIMENT 7

Now, a case wherein a semiconductor device which has the region with the low resistivity silicided layer and the region without the low resistivity silicided layer (or the region with the high resistivity silicided layer) selectively arranged therein is applied to an input and output protection circuit will be explained.

Figure 7:
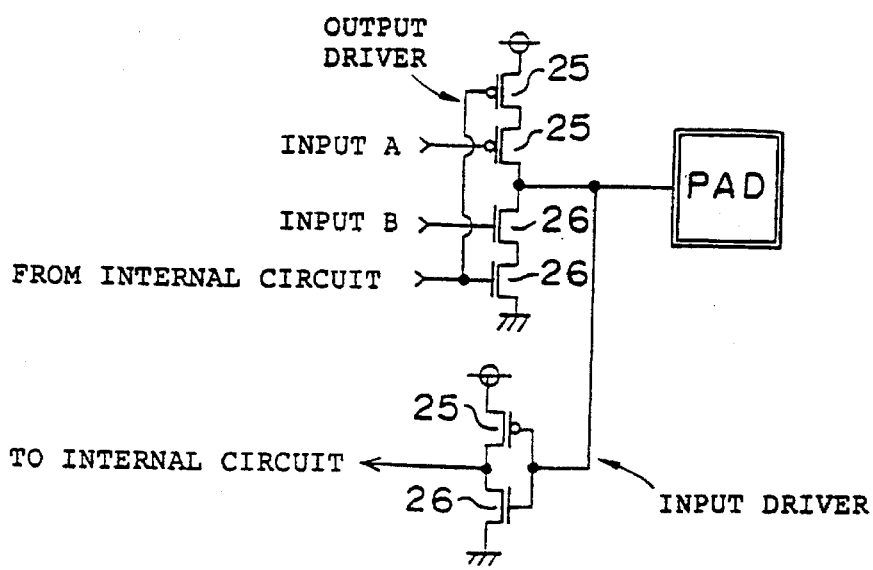
FIGS. 7(a)–(b) are an equivalent circuit diagram and a layout pattern diagram of the semiconductor device according to a seventh embodiment of the present invention, respectively.
Figure 7:
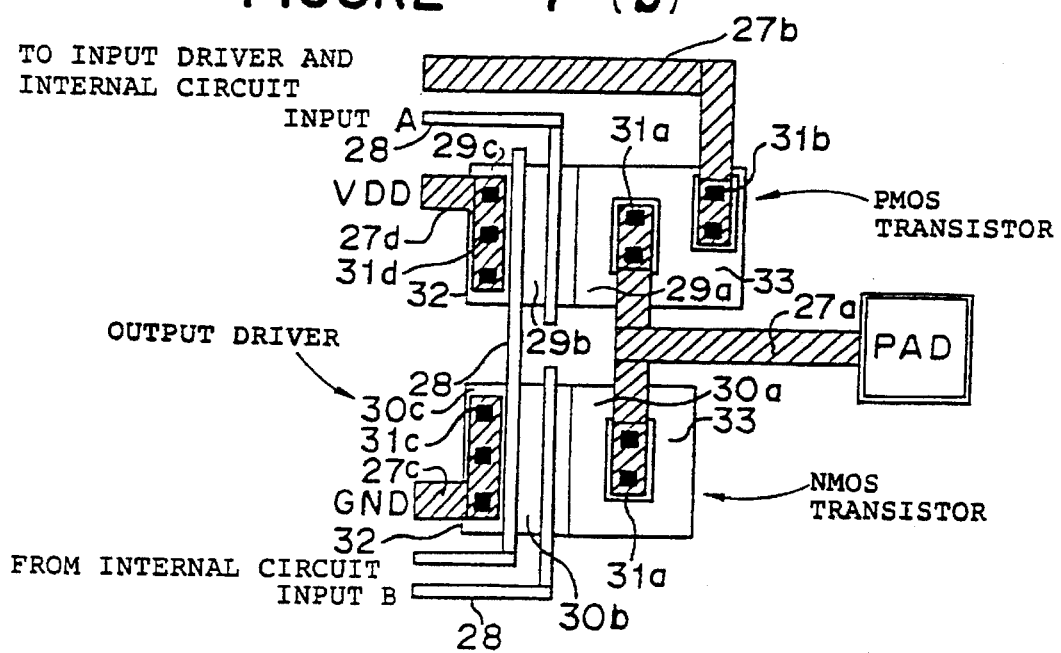

In FIG. 7, there is shown input and output drivers wherein the semiconductor device according to the seventh embodiment of the present invention is used. FIG. 7(a) is an equivalent circuit diagram, and FIG. 7(b) is a layout pattern diagram of the output driver shown in FIG. 7(a).

In those figures, reference numeral 25 designates a PMOS transistor, reference numeral 26 designates an NMOS transistor, reference numerals 27a–27d designate metal pattern as interconnect layers, and reference numeral 28 designates a gate electrode which works as a conductive layer. Reference numerals 29a–29c designate source/drain regions which work as a conductive layer in the PMOS transistor 25, and reference numerals 30a–30b designate source/drain regions which work as a conductive layer in the NMOS transistor. Reference numerals 31a–31d designate contact holes, reference numeral 31a designates a contact hole A for connection with an external pad, the reference numeral 31b designates a contact hole B for connection with a gate electrode 28a of the input driver, the reference numeral 31c designates a contact hole for connection to ground, and the reference numeral 31d designates a contact hole for connection with VDD. Reference numeral 32 designates a TiSi$_2$ layer which are formed on the gate electrode 28 and on the source/drain regions 29 and 30, and reference numeral 33 designates a TxiNySiz mixing layer which is formed on the drain regions 29a and 30a for connection with the external pad, and which works as a high resistivity silicided layer.

The equivalent circuit diagram shown in FIG. 7(a) will be explained briefly. When an input A is at a low level and an input B is a high level, the output driver is on, and when the input conditions are reversed, the input driver is on.

As shown in FIG. 7(b), the contact holes A 31a of the metal pattern 27a which is connected to the external pad are formed in the drain regions 29a and 30a of the PMOS transistor 25 and the NMOS transistor 26, and to the TixNySiz mixing layers 33 are formed in an annual manner so as to surround the contact holes A. The contact holes B 31b of the metal pattern 27 which is connected to the input driver are also formed in the drain region 29a of the PMOS transistor 25, and the contact holes B are arranged at a position further away from the gate electrode 28 than the contact holes A 31a for connection with the external pad. The contact holes 31 which are formed in the source/drain regions 29 and 30 are formed with a TiSi$_2$ layer 32. In addition, a region wherein no TixNySiz mixing layer 33 is formed on the source/drain regions 29 and 30 and on the gate electrodes 28 has a TiSi$_2$ layer 32 formed therein.

As stated above, the contact holes 31 are formed on the low resistivity TiSi$_2$ layer 32 to decrease contact resistance. Since the high resistivity TixNySiz mixing layers 33 are formed on the drain regions 29a and 30a so as to surround the contact holes A 31a for connection with the external pad, the high resistivity TixNySiz mixing layer 33 is present somewhere in the route wherein surge inputted from the external pad reaches at a corner of the drain regions 29a and 30a which is a susceptible to have junction breakdown or the metallic pattern 27b which is connected to the input driver. The arrangement can let the surge go off through diodes at the bottoms of the drain regions 29a and 30a. As a result, junction breakdown due to surge can be prevented, and an input protection function against the surge can be improved.

In addition, since the contact holes A 31a are formed at a location nearer to the gate electrode 28 in the common drain region 29a than the contact holes B 31b for connection with the input driver, a delay in output signal can be decreased.

EMBODIMENT 8

Now, a case wherein the equivalent circuit shown in the seventh embodiment is realized by another layout will be explained with reference to FIG. 8.

Figure 8:
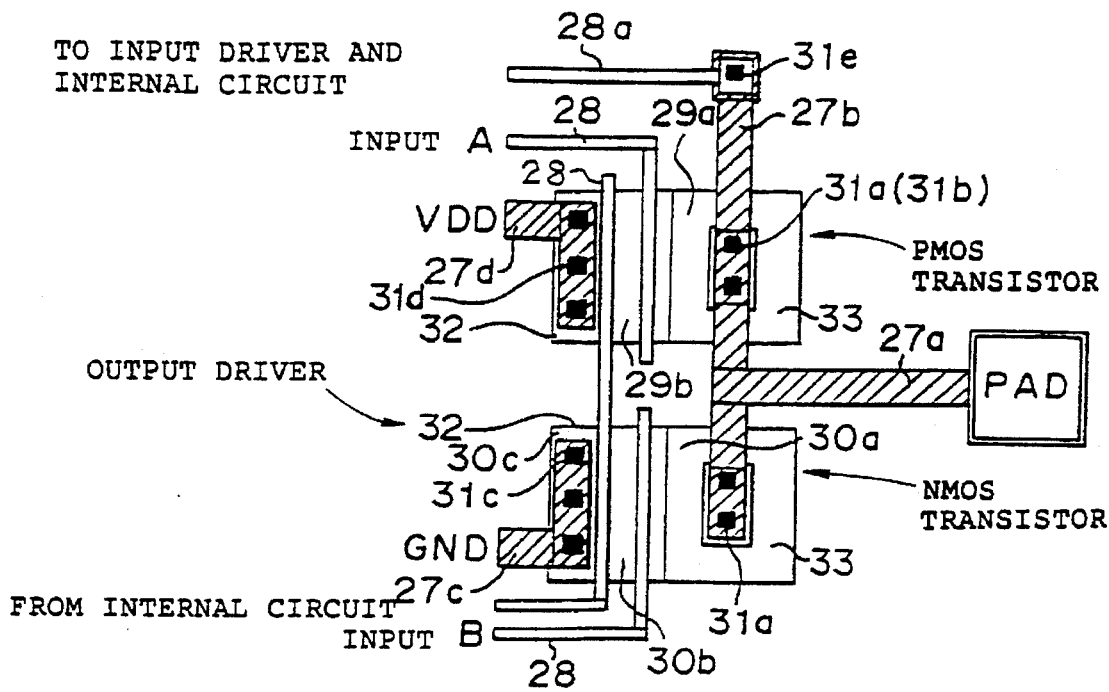
FIG. 8 is a layout pattern diagram of the semiconductor device according to an eighth embodiment of the present invention.

In accordance with the eighth embodiment, as shown in FIG. 8, the metal pattern 27b for connection with the input driver is coupled to the metal pattern 27a for connection with the external pad, and a TixNySiz mixing layer 33 is formed on the gate electrode 28a of the input driver, which is connected to the metal pattern 27b at the contact hole 31e.

Surge inputted from the external pad is sandwiched between the high resistivity TixNySiz mixing layer 33 on the gate electrode 28a and the high resistivity TixNySiz mixing layer 33 on the drain regions 29a and 30a. The arrangement can let the surge go off through diodes at the bottoms of the drain regions 29a and 30a wherein contact holes A 31a for connection with the external pad are located.

As a result, besides offering advantages similar to the seventh embodiment, the eighth embodiment can decrease junction capacitance because coupling the metal pattern 27a for connection to the external pad with the metal pattern 27b for connection to the input driver can make the contact holes A 31a and the contact holes B 31b in the drain region 29a common to decrease the area of the drain area 29a.

Although the seventh and eighth embodiments use the high resistivity TixNySiz mixing layer 33 and the low resistivity TiSi$_2$ layer 32, greater resistance may be obtained by forming no silicided layer on the gate electrode 28 and on the source/drain regions 29 and 30 instead of formation of the TixNySiz mixing layer 33. A metallic silicided layer other than Ti may be used.

EMBODIMENT 9

Now, a modification of the seventh embodiment will be explained with reference to FIG. 9.

Figure 9:
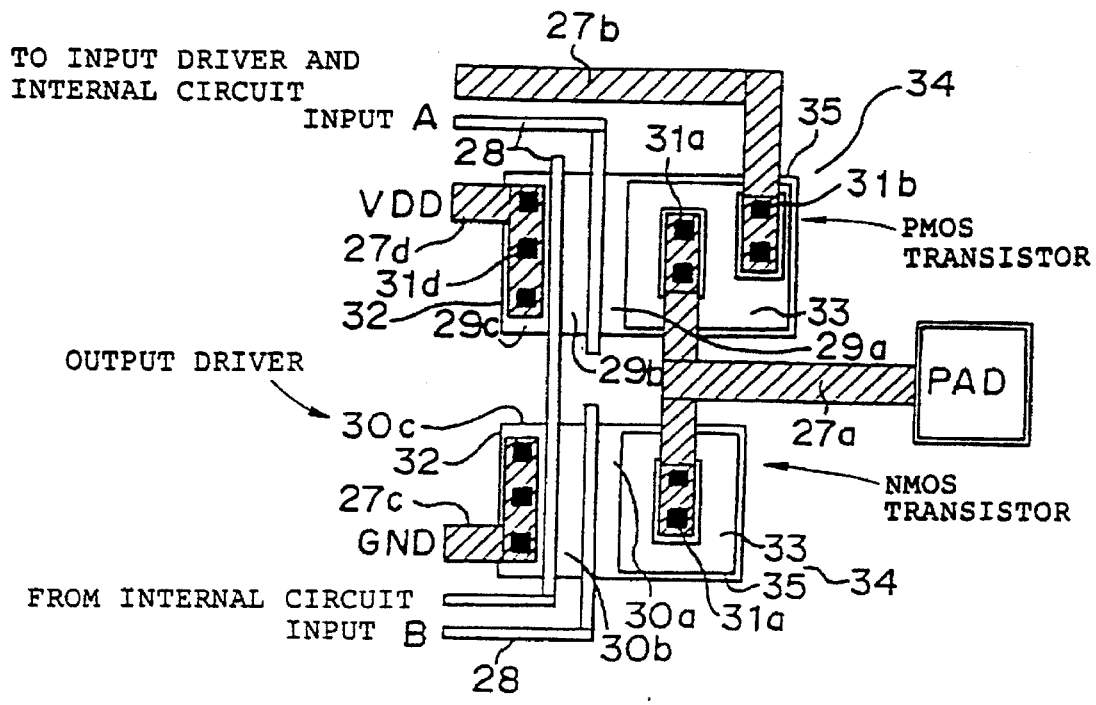
FIG. 9 is a layout pattern diagram of the semiconductor device according to a ninth embodiment of the present invention.
Figure 10:
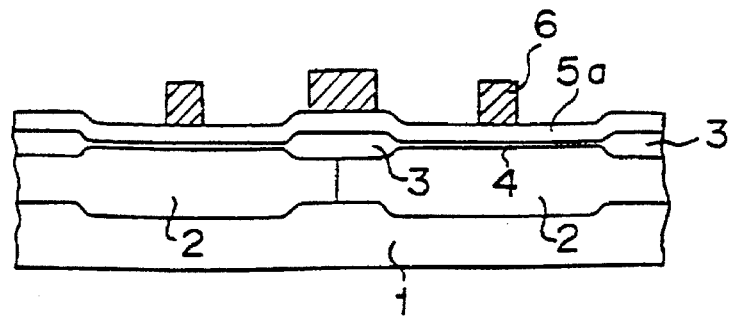
FIG. 10 is a cross-sectional view showing a step of a conventional method for producing a semiconductor device.
Figure 11:
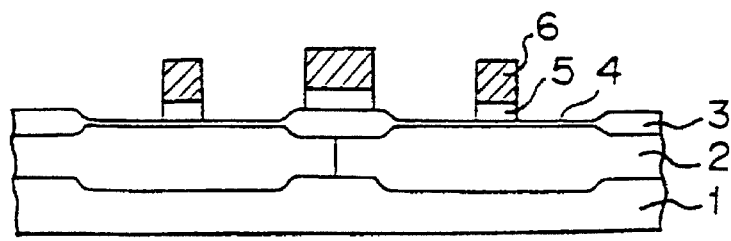
FIG. 11 is a cross-sectional view showing a step of the conventional production method.
Figure 12:
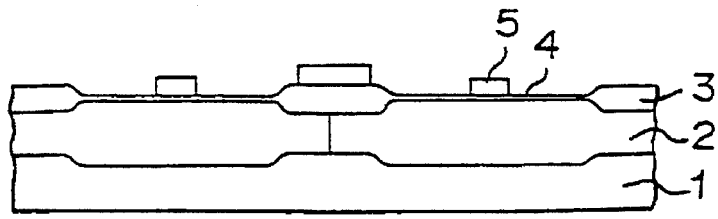
FIG. 12 is a cross-sectional view showing a step of the conventional production method.
Figure 13:
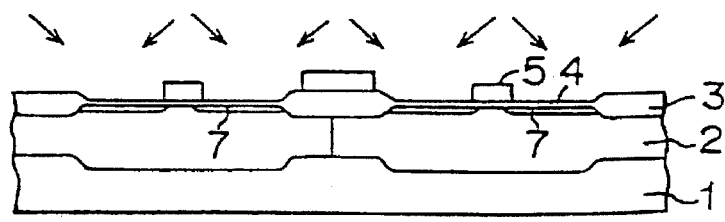
FIG. 13 is a cross-sectional view showing a step of the conventional production method.
Figure 14:
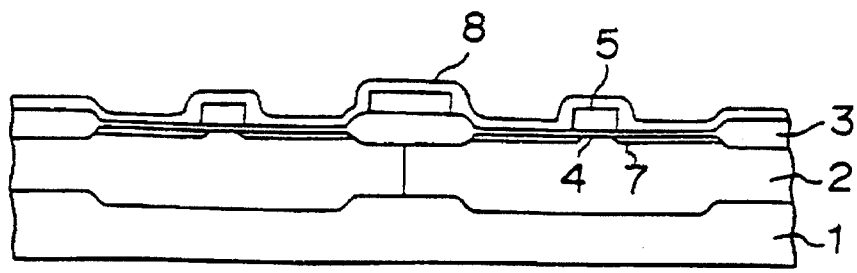
FIG. 14 is a cross-sectional view showing a step of the conventional production method.
Figure 15:
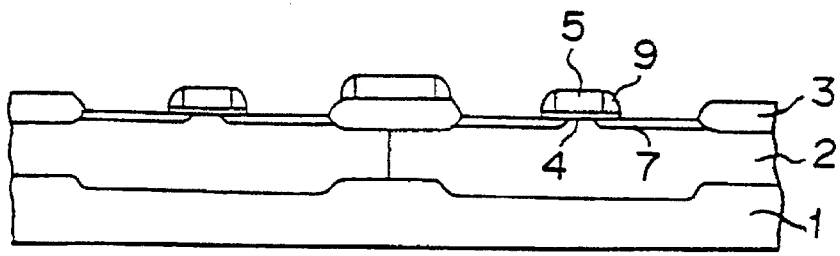
FIG. 15 is a cross-sectional view showing a step of the conventional production method.
Figure 16:
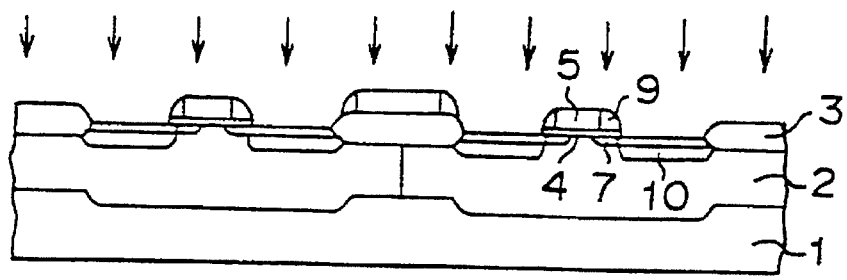
FIG. 16 is a cross-sectional view showing a step of the conventional production method.
Figure 17:
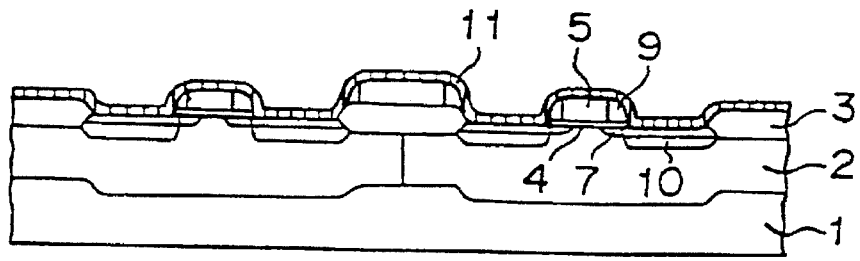
FIG. 17 is a cross-sectional view showing a step of the conventional production method.
Figure 18:
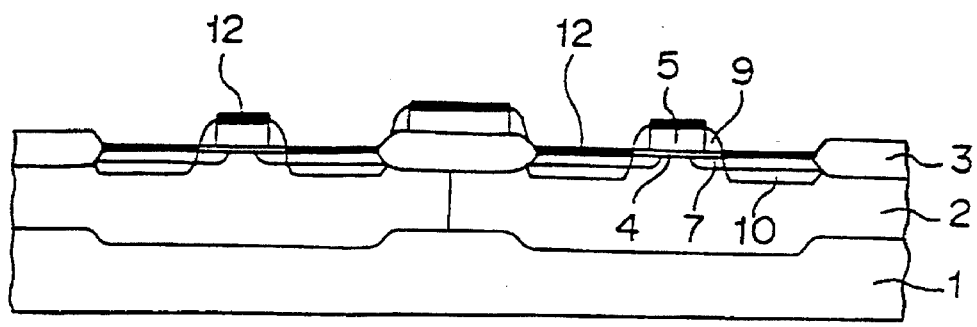
FIG. 18 is a cross-sectional view showing a step of the conventional production method.
Figure 19:
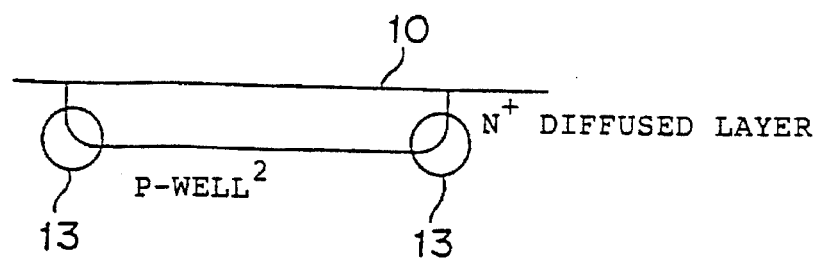
FIG. 19 is a cross-sectional view to help explain a problem in the conventional semiconductor device.
Figure 21A:
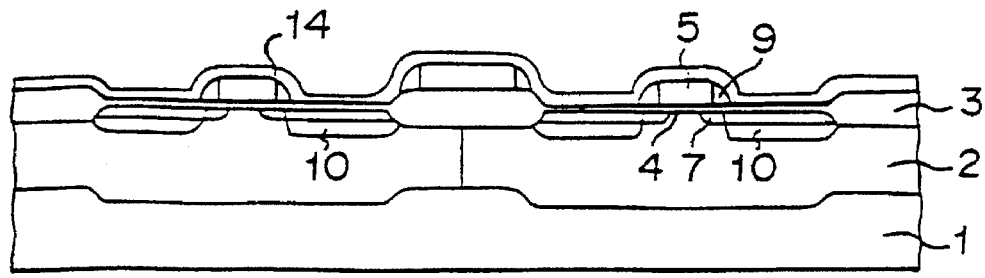
FIGS. 21(a)–(e) are cross-sectional views showing another conventional method for producing a semiconductor device.
Figure 21B:
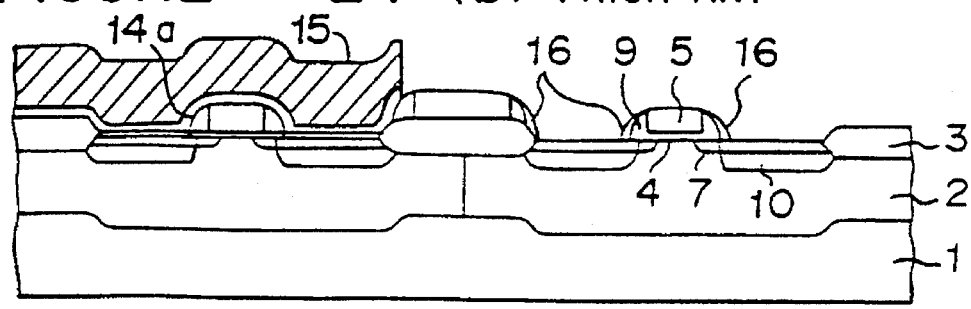
Figure 21C:
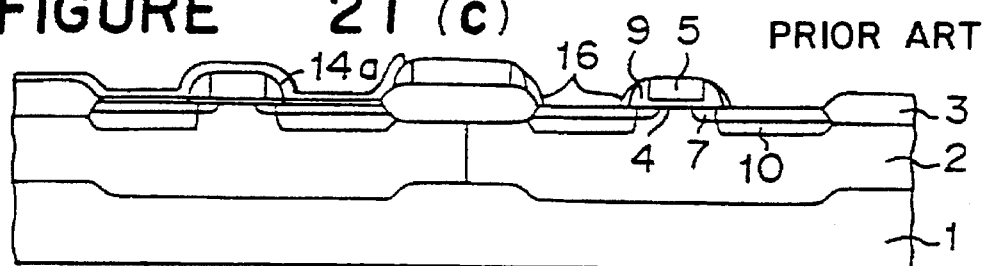
Figure 21D:
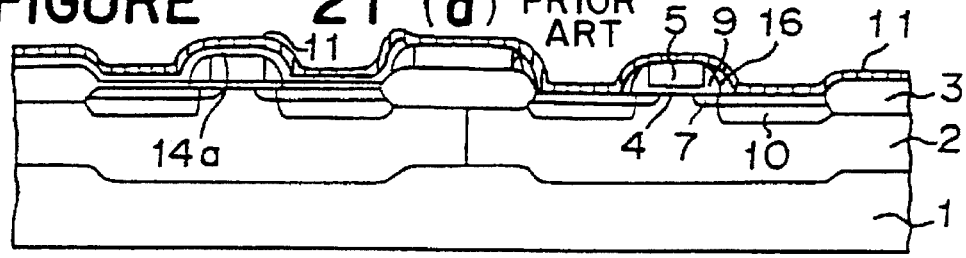
Figure 21E:
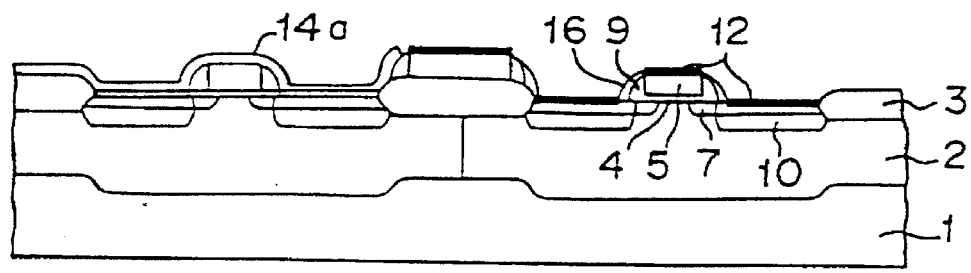

As shown in FIG. 9, the TixNySiz mixing layers 33 are formed so as to surround the contact holes A 31a for connection with the external pad like the seventh embodiment. However, no TixNySiz mixing layer 33 is formed at the locations 35 near to field edge portions as the boundary portions with field insulating films 34.

A thin oxide film is formed at the locations 35 near to the field edge portions by bird's beak at the time of forming the field insulating films 34 for isolation. As a result, giving damage to the locations 35 near to the field edge portions by the N ion (or O ion) implantation for formation of the TixNySiz mixing layers causes a leak current.

In accordance with the ninth embodiment, since no TixNySiz mixing layer 33 is formed at the locations 35 near to the field edge portions, it is possible to decrease a leak current from the locations 35 near to the field edge portions.

Obviously, numerous modifications and variations of the present invention are possible in light of the above teachings. It is, therefore, to be understood that within the scope of the appended claims, the invention may be practiced otherwise than as specifically described herein.

What is claimed is:

1. A semiconductor device comprising:

a semiconductor substrate;

a conductive layer on the substrate, which is made from a silicon material; and a silicided layer on the conductive layer, which is formed by salicide technology;

wherein the silicided layer is partly constituted by a high resistivity silicided layer with N ions or O ions introduced therein so that a high resistivity silicided layer part and a low resistivity silicided layer part coexist on the substrate.

2. A semiconductor device comprising:

a semiconductor substrate;

a conductive layer on the substrate, which is made from a silicon material; and a silicided layer on the conductive layer, which is formed by salicide technology;

wherein a high resistivity region is provided by forming on the conductive layer, for connection with an external pad, a high resistivity silicided layer part with N ions or O ions introduced therein surrounding a contact hole for connection with the external pad, and the high resistivity silicided layer part is formed in an annular shape, and the other part of the silicided layer on the substrate has low resistivity.

3. A semiconductor device comprising:

silicided layers formed on an input driver gate electrode and an output driver gate electrode, and on source/drain regions of the output driver on a semiconductor substrate by salicide technology;

the source/drain regions of the output driver being connected to an external pad and the input driver gate electrode;

a contact hole A for connection with the external pad; and a contact hole B for connection with the input driver gate electrode;

wherein the contact hole A is arranged at a side nearer to the output driver gate electrode than the contact hole B, and a high resistivity region is provided by forming a high resistivity silicided layer with N ions or O ions introduced therein at locations surrounding contact hole A and surrounding contact hole B.

4. A semiconductor device claimed in claim 3, wherein when the high resistivity silicided layer with N ions or O ions introduced therein is provided, no high resistivity silicided layer is formed at a boundary between the source/drain regions and a field insulating film.

5. A semiconductor device comprising:

silicided layers formed on an input driver gate electrode and an output driver gate electrode, and on source/drain regions on a semiconductor substrate by salicide technology;

an external pad;

the source/drain regions lying in an output driver; and the external pad, the output driver source/drain regions, and the input driver gate electrode being connected by coupled interconnect layers;

wherein a high resistivity region is provided by forming a high resistivity silicided layer with N ions or O ions introduced therein at locations surrounding a contact hole in the interconnect layer on the output driver source/drain region and on the input driver gate electrode for connection with the interconnect layer.

6. A semiconductor device claimed in claim 5, wherein the high resistivity silicided layer with N ions or O ions introduced therein is provided, no high resistivity silicided layer is formed at a boundary between the source/drain regions and a field insulating film.

* * * * *